(12) United States Patent
Ehrenpfordt et al.

(10) Patent No.: US 8,549,743 B2
(45) Date of Patent: Oct. 8, 2013

(54) METHOD FOR HOT EMBOSSING AT LEAST ONE CONDUCTIVE TRACK ONTO A SUBSTRATE

(75) Inventors: Ricardo Ehrenpfordt, Gerlingen (DE); Johanna May, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 574 days.

(21) Appl. No.: 12/733,487

(22) PCT Filed: Jul. 8, 2008

(86) PCT No.: PCT/EP2008/058818
§ 371 (c)(1),
(2), (4) Date: Jun. 21, 2010

(87) PCT Pub. No.: WO2009/033842
PCT Pub. Date: Mar. 19, 2009

(65) Prior Publication Data
US 2010/0276182 A1    Nov. 4, 2010

(30) Foreign Application Priority Data
Sep. 6, 2007   (DE) .......................... 10 2007 042 411

(51) Int. Cl.
*H05K 3/02* (2006.01)
(52) U.S. Cl.
USPC .................. 29/846; 29/825; 29/849; 156/250

(58) Field of Classification Search
USPC ................... 29/825, 829, 846, 849; 156/250; 174/255
See application file for complete search history.

(56) References Cited

U.S. PATENT DOCUMENTS

| | | | | | |
|---|---|---|---|---|---|
| 2,757,443 | A | * | 8/1956 | Oshry et al. | 29/848 |
| 2,912,748 | A | * | 11/1959 | Gray | 29/849 |
| 3,037,265 | A | * | 6/1962 | Kollmeier | 29/849 |
| 3,628,243 | A | * | 12/1971 | Phol et al. | 29/849 |
| 4,363,930 | A | * | 12/1982 | Hoffman | 174/255 |
| 4,403,107 | A | * | 9/1983 | Hoffman | 174/255 |
| 4,532,152 | A | * | 7/1985 | Elarde | 216/13 |
| 5,469,615 | A | * | 11/1995 | Yamazaki | 29/846 |
| 6,816,125 | B2 | * | 11/2004 | Kuhns et al. | 343/880 |
| 7,102,522 | B2 | * | 9/2006 | Kuhns | 340/572.7 |
| 7,237,330 | B2 | * | 7/2007 | Koskenmaki et al. | 29/825 |
| 2007/0049130 | A1 | | 3/2007 | Kojima et al. | |

FOREIGN PATENT DOCUMENTS

| | | |
|---|---|---|
| DE | 197 38 589 | 12/1998 |
| FR | 2 674 724 | 10/1992 |

* cited by examiner

*Primary Examiner* — Carl Arbes
(74) *Attorney, Agent, or Firm* — Kenyon & Kenyon LLP

(57) ABSTRACT

In a method for hot embossing at least one conductor track onto a substrate, a film having at least one electrically conductive layer is pressed against the substrate in a die direction using an embossing die having a structured die surface. The film remains on the substrate after ending the embossing process in at least two structure planes, which are spaced apart in the die direction.

7 Claims, 3 Drawing Sheets

METHOD FOR HOT EMBOSSING AT LEAST ONE CONDUCTIVE TRACK ONTO A SUBSTRATE

BACKGROUND OF THE INVENTION

1. FIELD OF THE INVENTION

The present invention relates to a method for hot embossing a conductor track onto a substrate.

2. DESCRIPTION OF RELATED ART

The hot embossing of conductor tracks on substrates, which are made of a polymer material in particular, represents an environmentally friendly possibility for manufacturing conductor tracks. In known hot embossing methods, first the substrate having the desired microstructure is manufactured, for example, using an injection-molding method. The substrate is then placed, together with a metal film situated thereon, in a press, after which the conductor tracks are embossed as depressed structures under application of pressure and temperature using a structured embossing die. The residual film on a raised structure plane of the substrate is drawn off of the substrate again after the embossing process. The drawing-off process is extremely critical. The success of the drawing-off process is essentially a function of the tear resistance of the metal film. Film residues which are not drawn off may result in short circuits between the conductor tracks. During the drawing-off process, the actual recessed conductor tracks, which are spaced apart from the raised structure plane, may also be drawn off or damaged, in particular if the embossing pressure was not sufficiently great. On the one hand, during the drawing-off process, the (raised) residual film to be drawn off may thus not be pressed too strongly onto the substrate, which has the result that the recessed, lower-lying conductor tracks are only applied using this maximal force. On the other hand, the embossing force must be selected as sufficiently great to ensure that the conductor tracks adhere sufficiently strongly to the substrate after the drawing-off process of the residual film.

Furthermore, the known method has the disadvantage that the conductor tracks may exclusively be introduced in a recessed structure plane. This has the result that the fixing of semiconductor chips on the conductor tracks is only possible using an adhesive flip chip method if the height difference between the conductor tracks and the raised structure plane is less than the height of the bumps. For gold stud bumps, this height is approximately 50 μm. This is difficult to achieve technologically, because with embossing depths this low, practically no punching of the metal film is possible due to a minimum thickness of the metal film used, and therefore no conductor tracks may remain standing on the substrate. Known substrates having embossed conductor tracks are also only usable in a limited way for a solder flip chip process, because the solder bumps are spherical and would thus only be acceptable for narrow conductor tracks of low embossing depths.

BRIEF SUMMARY OF THE INVENTION

An object of the present invention is to provide an alternative, more reliable method for hot embossing at least one conductor to a substrate, which is made of plastic in particular. The substrates provided with at least one conductor track using a method of this type are preferably to be suitable for the application of semiconductor components using a flip chip method. Furthermore, the object includes the manufacture of a correspondingly optimized substrate having at least one embossed conductor track.

The present invention is based on the idea of leaving the single-layer or multilayered film, which is embossed onto the substrate using an embossing die and has at least one electrically conductive layer on the substrate in at least two structure planes, which are spaced apart, after ending the embossing process. In other words, the core idea of the present invention includes, at least partially, preferably completely, dispensing with drawing off the film after the embossing process (pressure +temperature) in at least one raised structure plane. The method developed according to the concept of the present invention results in a substrate in which electrically conductive film remains in at least two structure planes which are spaced apart in the die direction (embossing direction). In this way, it is possible to use the film, which is not drawn off, remains in the raised structure plane, and is embossed onto the substrate, as at least one conductor track. Because of the raised configuration of this conductor track, the application of flip chip methods for fixing semiconductor components is possible without problems, because no height differences must be overcome. Additionally or alternatively to the use of the film located in the raised structure plane, it is possible to use the film located in at least one structure plane recessed from the raised structure plane as at least one conductor track. With corresponding structuring of the substrate and/or the embossing die, it is even conceivable to apply the film to the substrate using a hot embossing process in more than two structure planes; furthermore, all film (sections) embossed into different structure planes may be used as at least one conductor track. A further essential advantage of the method developed according to the concept of the present invention is that the adhesive strength of the conductor tracks on the substrate may be set without consideration-of a drawing-off process. The temperature and the pressure during the embossing process may thus be optimized in regard to optimum adhesion of the film on the substrate. Applying at least one conductor track onto a substrate which is already pre-structured and also applying at least one conductor track onto a substrate which is not yet structured, and is to be (micro-) structured during the hot embossing, is within the scope of the present invention.

One specific example embodiment of the method is particularly advantageous in which drawing off the film, embossed onto the substrate after the embossing process, is completely dispensed with.

One specific example embodiment is particularly advantageous in which the spacing between the at least two structure planes, each to be provided with film to be embossed, is selected as sufficiently large that the film(s) embossed onto the substrate is/are electrically insulated from one another in the two structure planes. The spacing is thus to be selected as so large that the film in the low-lying structure plane is sheared off from the film in the elevated structure plane during the embossing process.

One specific example embodiment is particularly advantageous in which a film is used in which the electrically conductive layer is formed by a metal layer, e.g., an aluminum layer, a copper layer, or a gold layer.

One specific example embodiment is particularly advantageous in which the film used is provided with at least one adhesive layer on the side facing the substrate, e.g., a plastic film or an adhesive layer. Alternatively, it is conceivable to use a layer which is mechanically roughened comparatively strongly in order to improve the adhesive effect. An additional adhesive layer, made of black oxide, for example, or a dendritically treated layer may be applied directly to the electrically conductive layer or the, mechanically roughened layer, whereby stronger mechanical interlocking with the molten substrate surface is achieved.

It is advantageously provided in a refinement of the present invention that at least one finishing layer is provided in particular on the side of the film facing away from the substrate. This layer may be made of tin, for example. The finishing layer is used for the purpose, depending on its composition, of avoiding occurrences of corrosion or of improving the soldering capability and/or the wire-bonding capability and/or the flip chip capability. A further advantage of providing a finishing layer on the film is that optionally only the film, but not the entire substrate, which is sensitive under certain circumstances, must run through a corresponding finishing process, eg., an electroplate finishing process.

The embossing die used and optionally also a device for orienting the embossing die relative to the substrate may be made of brass, steel, or ceramic, for example. In each case, at least the die surface of the embossing die is to be made of a tool material which is harder than the film used, in order to minimize the wear of the embossing die.

In the hot embossing method known from the related art, which was described at the beginning, it is also disadvantageous that it may only be applied to individual substrates, because the problem exists that if a shared film were placed on multiple substrates simultaneously, it would shift strongly during the embossing process, and would wrinkle. In order to avoid this problem and to allow simultaneous, i.e., parallel manufacturing, i.e., hot embossing of multiple substrates having a shared film, it is proposed that the film be at least sectionally laminated, i.e., pre-fixed, before and/or during the embossing process on the at least one substrate, preferably on all substrates to be embossed. Additionally or alternatively, the film may be stretched over the at least one, preferably multiple substrates before and/or during the entire embossing process, for example, using a stretching frame. The achievements of the object described here are to be considered as disclosed as an independent invention and are to be able to be claimed alone or in combination with at least one further feature disclosed in the application, independently of whether the film is drawn off after the embossing process or preferably remains (completely) on the substrate in multiple structure planes spaced apart from one another in the die direction.

It is particularly advantageous to emboss multiple substrates having at least one conductor track simultaneously (in particular after prior pre-fixing and/or prior stretching of a shared film on or over multiple substrates). A shared embossing die having multiple embossing sections is preferably used for this purpose. It is also conceivable to emboss a large-area substrate in different substrate sections simultaneously through the lamination, i.e., pre-fixing, and/or the pre-stretching of the shared film, the different, preferably similar substrate sections being able to be separated from one another after the embossing process in order to obtain individual, preferably identical components. The separation may be performed by cutting or sawing, for example.

The previously described method may be optimized in that the substrate is structured simultaneously with the embossing of at least one conductor track using the embossing die. For example, microstructures, preferably fluidic structures such as channels, through holes, cavities, etc., may be embossed into the substrate, which is preferably made of polymer, in particular outside an area covered by the film.

The present invention also result's in a substrate, preferably manufactured using a previously described method, at least one conductor track being embossed onto the substrate. The substrate is distinguished in that film, which has at least one electrically conductive layer, is embossed into at least two structure planes spaced apart from one another, it being within the scope of the present invention that only the film in one of the structure planes and also the film in at least two structure planes each form at least one conductor track. A design of the substrate having a plurality, i.e., having more than two structure planes each provided with an electrically conductive film, is conceivable, it being possible that the films in each structure plane each form at least one conductor track.

The spacing of the structure planes from one another is preferably selected to be large enough that the film in the different structure planes is separated from one another, i.e., electrically insulated.

In one specific example embodiment of the substrate, one conductor track is embossed onto both a raised structure plane and onto a structure plane recessed therefrom.

DETAILED DESCRIPTION OF THE INVENTION

Figure 1:
FIG. 1 shows two different polymer substrates.
Figure 1:
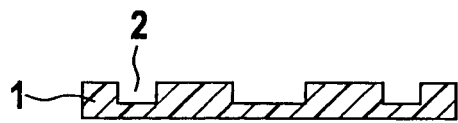

Identical parts and parts having identical functions are identified using identical reference numerals in the figures.

In FIG. 1, two different substrates 1 made of a plastic material are shown on top of each other. Top substrate 1 in the plane of the drawing is unstructured. Bottom substrate 1 in the plane of the drawing is provided with a microstructure 2, which has been introduced in an ablating method or a reshaping method or in the injection-molding method, for example.

Figure 2:
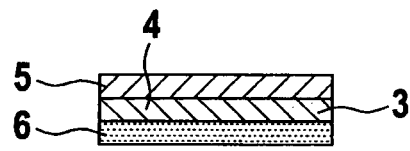
FIG. 2 shows an exemplary embodiment of a film which is possibly used.

A possible film 3 used for manufacturing conductor tracks is shown in FIG. 2. Film 3 is designed in three layers in the exemplary embodiment shown. A middle, electrically conductive layer 4 is made of gold in the exemplary embodiment shown. A finishing layer 5 is located above it in the plane of the drawing. In a later embossing process, an adhesive layer 6 is provided on a bottom side facing substrate 1.

Figure 3:
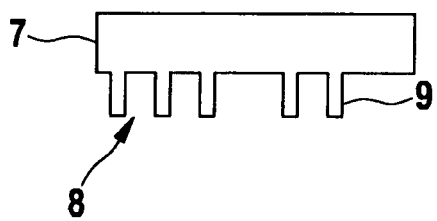
FIG. 3 shows a specific example embodiment of an embossing die.

A possible embossing die 7, which is required for the hot embossing process, having a die surface 8 is shown in FIG. 3. Die surface 8 is provided with an embossing structure 9 (microstructure).

Figure 4:
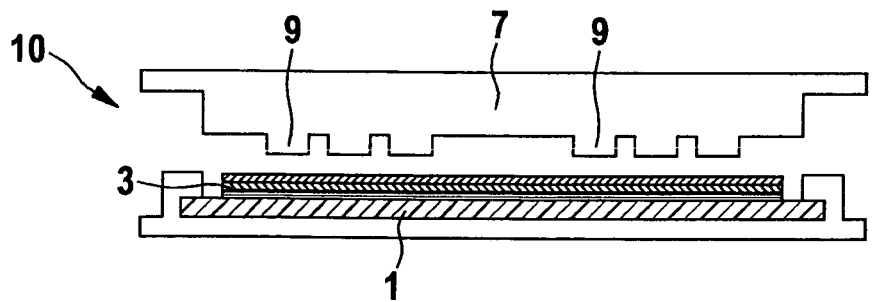
FIG. 4 shows a press in which a substrate is situated having a film placed over its entire area.

A press 10 having an embossing die 7 is shown in FIG. 4. An unstructured substrate 1 is placed in the press. A three-layered film 3 (cf. FIG. 3) is located thereon, which may only be placed on substrate 1, but has preferably been laminated thereon in a preceding step. Alternatively, the stretching of film 3 in a stretching frame, for example, is possible. Embossing die 7 is provided with an embossing structure 9 in each of two sections spaced apart from one another. Upon stamping (embossing), two identical embossed substrate sections are thus obtained, which may be separated from one another in a following step.

Figure 5:
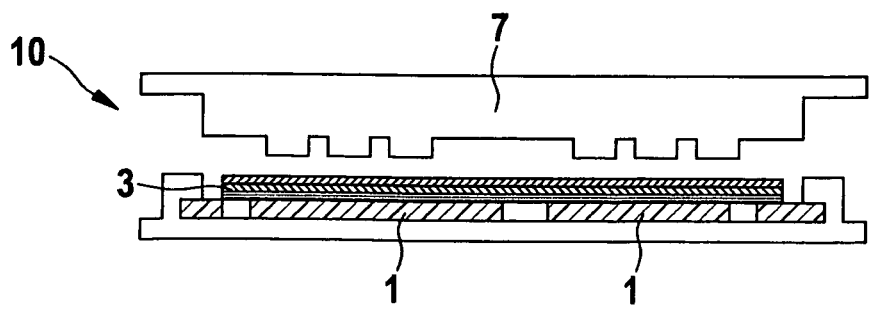
FIG. 5 shows a press in which multiple substrates are situated, onto which a shared film has been laminated prior to the actual embossing step.

In the exemplary embodiment according to FIG. 5, multiple different unstructured substrates 1, on which a shared film 3 is situated, are placed in press 10. Film 3 is laminated onto all substrates 1. Alternatively, it is possible to stretch film 3, for example, in a stretching frame.

Figure 6:
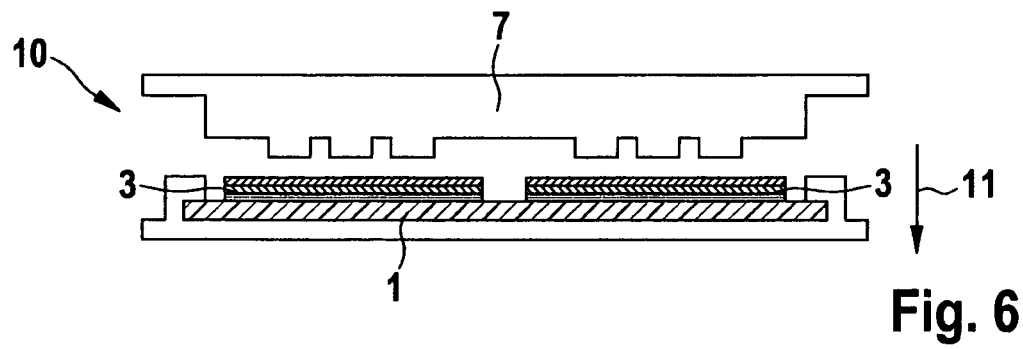
FIG. 6 shows a configuration of two films laminated onto a subarea of a single substrate.

In the exemplary embodiment according to FIG. 6, two films 3, which are spaced apart, are laminated onto a single unstructured substrate 1. Two identically structured substrate sections, i.e., each provided with at least one conductor track, which may be separated from one another in a later method step, are obtained by an embossing process in which embossing die 7 is moved toward substrate 1 in a stamping direction 11 relative to substrate 1.

Figure 7:
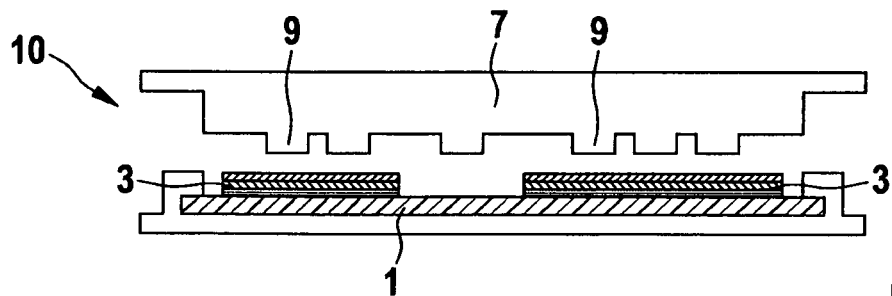
FIG. 7 shows a substrate accommodated in a press, onto which two films which are spaced apart are laminated, the embossing die also being provided with an embossing structure in an area outside the films for structuring the substrate.

In the exemplary embodiment according to FIG. 7, a single unstructured substrate 1 is introduced into a press 10. Two films 3 of different sizes, which are spaced apart, are laminated thereon. Embossing die 7 is not only provided with an embossing structure 9 in areas above films 3, but rather also has an embossing structure 9 in an area lying outside the films, using which microstructure 2 shown in FIG. 8, in particular a fluidic microstructure 2, may be introduced into substrate 1.

Figure 8:
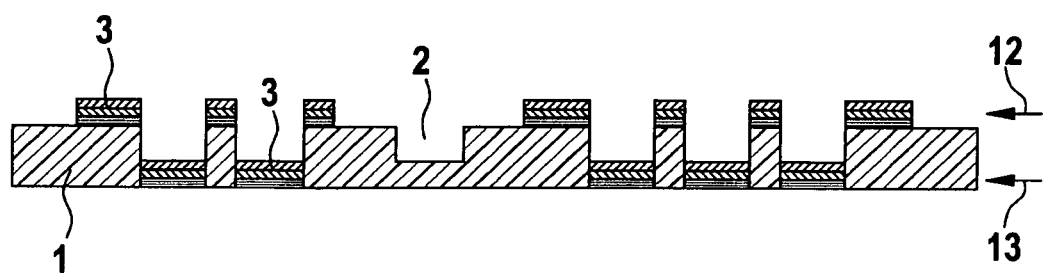
FIG. 8 shows a substrate provided with conductor tracks resulting from the embossing process according to FIG. 7.

A substrate 1 resulting from the embossing process according to FIG. 7 is shown in FIG. 8. It is apparent that film 3 has been embossed onto substrate 1 both in a raised structure plane 12 and also in a structure plane 13 recessed therefrom. Drawing off film 3 was dispensed with according to the present invention in raised structure plane 12. Both film 3 or film sections in raised structure plane 12 and film 3 or film sections in recessed structure plane 13 may each form at least one conductor track. The spacing between structure planes 12, 13 is selected to be sufficiently large so that film 3 in raised structure 12 is electrically insulated from film 3 in recessed structure 13 (sheared-off film sections).

Figure 9:
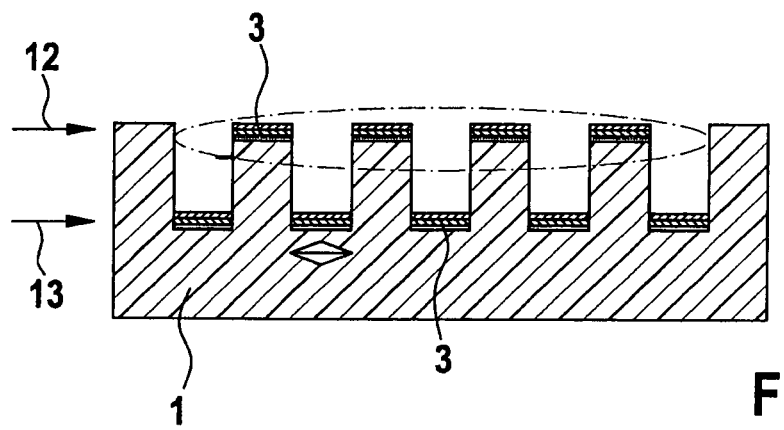
FIG. 9 shows a substrate having film sections situated in two structure planes, only the film sections situated in the raised structure plane forming conductor tracks.

A possible substrate 1 which is manufacturable using a method according to the present invention is shown in FIG. 9. It is apparent that film 3 or film sections are embossed onto both a raised structure plane 12 and onto a recessed structure plane 13 spaced apart therefrom in die direction 11. The film sections (circled) situated in raised structure plane 12 are used as active conductor track(s), while the film sections in recessed structure plane 13 do not receive an active electrically conductive function. These film sections are electrically insulated from the film sections in raised structure plane 12 by correspondingly large spacing of structure planes 12, 13.

Figure 10:
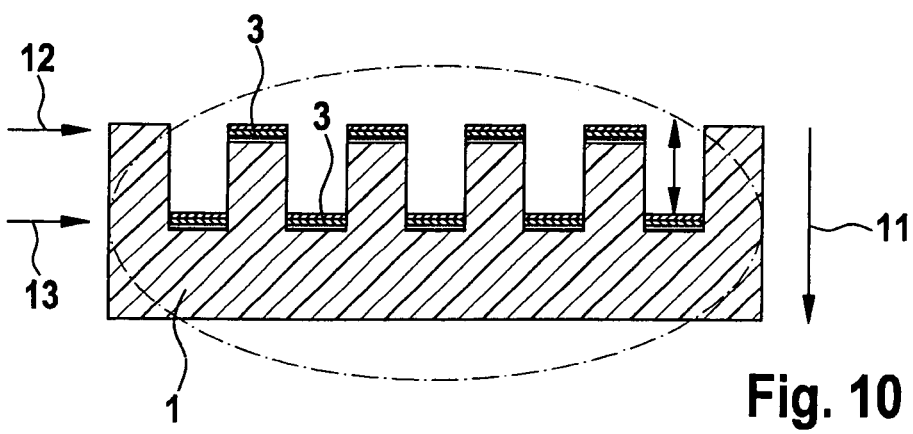
FIG. 10 shows a substrate in which conductor tracks made of film sections are embossed onto two different structure planes which are spaced apart from one another.

The exemplary embodiment according to FIG. 10 essentially corresponds to the exemplary embodiment according to FIG. 9 with the single difference that embossed film sections situated in both structure planes 12, 13 are used as active conductor tracks, which is symbolized by circling all film sections.

What is claimed is:

1. A method for hot embossing at least one conductor track onto a substrate, comprising:
   pressing, using an embossing die having a structured die surface, a film having at least one electrically conductive layer against the substrate, wherein the embossing die is applied along a pressing direction against a first side of the film, and wherein a second side of the film is contacted with the substrate; and
   providing at least portions of the film on the substrate after the end of the pressing step in at least two structure planes spaced apart along the pressing direction;
   wherein the spacing between the two structure planes is selected to be sufficiently large so that the film in a raised structure plane is electrically insulated from the film in a recessed structure plane,
   wherein the film further includes at least one adhesive layer having at least one an adhesive film, a plastic film, and a rough structure, and
   wherein at least one conductor track is embossed simultaneously onto each of multiple substrates situated adjacent to one another.

2. The method as recited in claim 1, wherein the electrically conductive layer is formed by a metal layer including one of an aluminum layer, a copper layer, or a gold layer.

3. The method as recited in claim 1, wherein the film further includes at least one finishing layer for at least one of protecting against corrosion, improving the soldering capability, improving the flip chip capability and improving the wire bonding capability.

4. The method as recited in claim 1, wherein the film is at least sectionally laminated onto the substrate before the pressing step.

5. The method as recited in claim 1, wherein the film is stretched before the pressing step.

6. The method as recited in claim 1, wherein a shared film is used for simultaneous embossing of multiple substrates.

7. The method as recited in claim 6, wherein the substrate is structured using the embossing die.

* * * * *

UNITED STATES PATENT AND TRADEMARK OFFICE
CERTIFICATE OF CORRECTION

| | | |
|---|---|---|
| PATENT NO. | : 8,549,743 B2 | Page 1 of 1 |
| APPLICATION NO. | : 12/733487 | |
| DATED | : October 8, 2013 | |
| INVENTOR(S) | : Ehrenpfordt et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 679 days.

Signed and Sealed this

Fifteenth Day of September, 2015

Michelle K. Lee
*Director of the United States Patent and Trademark Office*